US008355276B2

(12) United States Patent
Idgunji et al.

(10) Patent No.: US 8,355,276 B2
(45) Date of Patent: Jan. 15, 2013

(54) CONTROLLING VOLTAGE LEVELS APPLIED TO ACCESS DEVICES WHEN ACCESSING STORAGE CELLS IN A MEMORY

(75) Inventors: Sachin Satish Idgunji, San Jose, CA (US); Hemangi Umakant Gajjewar, Sunnyvale, CA (US); Gus Yeung, Austin, TX (US)

(73) Assignee: ARM Limited, Cambridge (GB)

( * ) Notice: Subject to any disclaimer, the term of this patent is extended or adjusted under 35 U.S.C. 154(b) by 180 days.

(21) Appl. No.: 12/591,511

(22) Filed: Nov. 20, 2009

(65) Prior Publication Data

US 2011/0122712 A1 May 26, 2011

(51) Int. Cl.
*G11C 11/00* (2006.01)
*G11C 11/34* (2006.01)
(52) U.S. Cl. ............... 365/154; 365/185.21; 365/230.06
(58) Field of Classification Search ............ 365/189.11, 365/194, 154, 185.21, 230.06
See application file for complete search history.

(56) References Cited

U.S. PATENT DOCUMENTS

| 5,297,104 | A * | 3/1994 | Nakashima | 365/230.06 |
| 2005/0157533 | A1* | 7/2005 | Kaal | 365/149 |
| 2009/0103375 | A1* | 4/2009 | Houston | 365/189.04 |
| 2011/0063932 | A1 | 3/2011 | Chandra et al. | 365/194 |

OTHER PUBLICATIONS

C. Wang et al, "A Boosted Wordline Voltage Generator for Low-Voltage Memories" ICECS-2003, 2003, pp. 806-809.
E. Grossar et al, "Read Stability and Write-Ability Analysis of SRAM Cells for Nanometer Technologies" *IEEE Journal of Solid-State Circuits*, vol. 41, No. 11, Nov. 2006, pp. 2577-2588.
B. Calhoun et al, "A 256-kb 65-nm Sub-threshold SRAM Design for Ultra-Low-Voltage Operation" *IEEE Journal of Solid-State Circuits*, vol. 42, No. 3, Mar. 2007, pp. 680-688.
I. Carlson et al, "A High Density, Low Leakage, 5T SRAM for Embedded Caches" IEEE, 2004, pp. 215-218.
L. Chang et al, "A 5.3GHz 8T-SRAM with Operation Down to 0.41V in 65nm CMOS" *2007 Symposium on VLSI Circuits Digest of Technical Papers*, 2007, pp. 252-253.
B. Cheng et al, "The Scalability of 8T-SRAM Cells under the Influence of Intrinsic Parameter Functuations" IEEE, 2007, pp. 93-96.
W. Dehaene et al, "Embedded SRAM design in deep deep submicron technologies" IEEE, 2007, pp. 384-391.

(Continued)

*Primary Examiner* — Toan Le
*Assistant Examiner* — Khamdan Alrobaie
(74) *Attorney, Agent, or Firm* — Nixon & Vanderhye P.C.

(57) ABSTRACT

A semiconductor memory storage device is disclosed. This memory device has a plurality of storage cells for storing data; a plurality of access devices for allowing access to the corresponding plurality of storage cells, the plurality of access devices being arranged in at least two groups, each of the at least two groups being controlled by an access control line; access control circuitry for controlling a voltage level supplied to a selected one of at least two of the access control lines during access to the storage cell, the access control circuitry comprising a capacitor and switching circuitry; and control circuitry responsive to a data access request to access a selected storage cell to: connect a selected one of the access control lines to a voltage level to allow access via one of the access devices to the selected storage cell; and to control the switching circuitry of the access control circuitry to connect the capacitor of the access control circuitry to the selected access control line and thereby change the voltage level supplied to the selected access control line.

19 Claims, 12 Drawing Sheets

OTHER PUBLICATIONS

R. Hobson, "A New Single-Ended SRAM Cell With Write-Assist" *IEEE Transactions on Very Large Scale Integration (VLSI) Systems*, vol. 15, No. 2, Feb. 2007, pp. 173-181.

J. Wang et al, "Analyzing Static and Dynamic Write Margin for Nanometer SRAMs" *ISLPED'08*, Aug. 2008, pp. 129-134.

A. Kawasumi et al, "A Single-Power-Supply 0.7V 1GHz 45nm SRAM with an Asymmetrical Unit-β-ratio Memory Cell" *2008 IEEE International Solid-State Circuits Conference*, 2008, pp. 382, 383, 622.

M. Khellah et al, "Read and Write Circuit Assist Techniques for Improving Vccmin of Dense 6T SRAM Cell" *IEEE Int'l Conf. on Integrated Circuit Design and Technology*, 2008.

J. Kulkarni et al, "A 160 mV Robust Schmitt Trigger Based Sub-threshold SRAM" *IEEE Journal of Solid-State Circuits*, vol. 42, No. 10, Oct. 2007, pp. 2303-2313.

R. Kumar et al, "A Family of 45nm IA Processors" *2009 IEEE International Solid-State Circuits Conference*, 2009, pp. 58-59.

S. Nalam et al, "Asymmetric Sizing in a 45nm 5T SRAM to Improve Read Stability over 6T" *IEEE 2009 Custom Intergrated Circuits Conference (CICC)*, 2009, pp. 709-712.

H. Pilo et al, "An SRAM Design in 65-nm Technology Node Featuring Read and Write-Assist Circuits to Expand Operating Voltage" *IEEE Journal of Solid-State Circuits*, vol. 42, No. 4, Apr. 2007, pp. 813-819.

J. Poulton, "An Embedded DRAM for CMOS ASICs" IEEE, 1997, pp. 288-302.

E. Seevinck et al, "Static-Noise Margin Analysis of MOS SRAM Cells" *IEEE Journal of Solid-State Circuits*, vol. SC-22, No. 5, Oct. 1987, pp. 748-754.

T. Suzuki et al, "A Stable 2-Port SRAM Cell Design Against Simultaneously Read/Write-Disturbed Accesses" *IEEE Journal of Solid-State Circuits*, vol. 43, No. 9, Sep. 2008 pp. 2109-2119.

Y. Ye et al, "Evaluation of Differential vs. Single-Ended Sensing and Asymmetric Cells in 90nm Logic Technology for On-Chip Caches" *ISCAS 2006*, pp. 963-966.

Y. Kim et al, "New SRAM Cell Design for Low Power and High Reliability using 32nm Independent Gate FinFET Technology" *IEEE International Workshop on Design and Test of Nano Devices, Circuits and Systems*, 2008, pp. 25-28.

M. Iijima et al, "Low Power SRAM with Boost Driver Generating Pulsed Word Line Voltage for Sub-1V Operation" *Journal of Computers*, vol. 3, No. 5, May 2008, pp. 34-40.

H. Morimura et al, "A Step-Down Boosted-Wordline Scheme for 1-V Battery-Operated Fast SRAM's" IEEE Journal of Solid-State Circuits, vol. 33, No. 8, Aug. 1998, pp. 1220-1227.

Iijima et al., "Low Power SRAM with Boost Driver Generating Pulsed Word Line Voltage for Sub-IV Operation" Journal of Computers, vol. 3, No. 5, May 2008.

\* cited by examiner

US 8,355,276 B2

CONTROLLING VOLTAGE LEVELS APPLIED TO ACCESS DEVICES WHEN ACCESSING STORAGE CELLS IN A MEMORY

TECHNICAL FIELD

The technical field relates to the field of data storage, and in particular, to the storage and access of data in semiconductor memories.

BACKGROUND

With ever increasing demands to reduce both the size of devices and their power consumption, it is becoming increasingly challenging to design robust semiconductor memories such as SRAM. Each storage cell in an SRAM comprises a feedback loop for holding a data value. In order to write to the feedback loop and store a new value, the input must have a high enough voltage level to be able to switch the state stored by the feedback loop if required, while reading from the feedback loop should be performed without disturbing the values stored in any of the feedback loops.

As dimensions scale down the variations in device properties due to random dopant fluctuations, line edge roughness etc. increase drastically.

Thus, designing a robust SRAM where cells can be read (without read disturb) and written to across all operational voltage ranges turns out to be very difficult. Reducing the voltage at which the SRAM cells can be read and written to successfully is not easy and in particular as the voltage scales down it becomes increasingly difficult to write to the cells.

One proposed way of addressing the write problem is disclosed in "Low power SRAM with Boost Driver Generating Pulsed Word Line Voltage for Sub-1V Operation" by Iijima et al. Journal of Computers, vol 3, No 5 May 2008. In this article an active body-biasing controlled boost transistor generates a boost to the word line voltage thereby facilitating writes by capacitive coupling only when accessed. A drawback of this scheme is that there is a significant area overhead resulting from having one extra transistor per word line and also this transistor adds an additional delay to the turning off of the pass gate. The pass gate allows access to the storage cell, and this extra delay results in some charge leakage and therefore decreases the efficiency of the scheme.

In addition to the above drawbacks, such schemes as this only address the write-ability problems and not the problems associated with read disturb where an increased voltage on the word line makes it more likely that cells may be unintentionally corrupted.

It would be desirable to be able to reduce both read and write failures particularly during low voltage operation of a semiconductor memory.

SUMMARY

A first aspect provides a semiconductor memory storage device comprising: a plurality of storage cells for storing data; a plurality of access devices for allowing access to said corresponding plurality of storage cells, said plurality of access devices being arranged in at least two groups, each of said at least two groups being controlled by an access control line; access control circuitry for controlling a voltage level supplied to a selected one of at least two of said access control lines during access to said storage cell, said access control circuitry comprising a capacitor and switching circuitry; and control circuitry responsive to a data access request to access a selected storage cell to: connect a selected one of said access control lines to a voltage level to allow access via one of said access devices to said selected storage cell; and to control said switching circuitry of said access control circuitry to connect said capacitor of said access control circuitry to said selected access control line and thereby change said voltage level supplied to said selected access control line.

The technology described herein recognises that accessing data within a storage cell via access devices is not always straightforward and that it may be advantageous to change the voltage level supplied to an access device of the storage cell to aid the data access. The technology described herein provides access control circuitry that has a capacitor and switching circuitry, the switching circuitry being used to connect the capacitor to the access control line that has been selected by the access request. This allows the access control circuitry to control more than one access control line by simply connecting the capacitor to the appropriate line. This means that rather than needing individual access control circuits for each access control line, one circuit can control multiple lines. This provides a significant saving on area. Furthermore, the use of a capacitor to change the voltage value provides the system with great flexibility allowing the voltage level to be amended as is required for the particular circumstance.

It should be noted that the number of access control lines that a single access control circuit element can connect to depends on the size of the capacitor of the access control circuitry and the capacitance of the access control lines it connects to. In order for the capacitor to trigger a reasonably sized change in voltage its capacitance must be significantly larger than the capacitance of the access control lines that it connects to. Providing it with the ability to connect to several access control lines via switching devices provides an increased capacitance loading, and thus, there is an optimal number, where the required increase in size of the capacitor to service all of these lines is too large and it is preferable to use multiple access control circuitry elements servicing a lower number of the access control lines each.

In some embodiments, said access control circuitry is configured to change said voltage level supplied to said selected access control line to either increase said voltage level or decrease said voltage level in dependence upon a control signal from said control circuitry.

The use of a capacitor to change the voltage level supplied means that it can be used either to increase or decrease the voltage level depending on how the capacitor is precharged. This is advantageous as there may be circumstances where an increase in the voltage level will aid the data access while there are other circumstances where a decrease in the voltage level is required. Having a capacitor as the means of controlling the voltage change means that the same device can be used either to increase or decrease the voltage level which provides embodiments with increased flexibility without unduly increasing the area of the circuit.

In some embodiments, said data access request comprises one of a read request to read data from said storage cell or a write request to write data to said storage cell, said control circuitry being configured to control said access control circuitry to reduce said supplied voltage level in response to said data access request being a read request and to increase said supplied voltage level in response to said data access request being a write request.

It may, for example, be advantageous to reduce the voltage to the access control line when a read is being performed as the storage cell may become unstable if the access voltage is too high and it may then lose the data that it stores. However, when a write is being performed the cell needs to become unstable to overwrite the stored value and thus, an increase in the supplied voltage may be required.

In other embodiments, said data access request comprises one of a read request to read data from said storage cell or a write request to write data to said storage cell, said control circuitry being configured to control said access control circuitry to increase said supplied voltage level in response to said data access request being a read request or a write request.

Although, the data stored in a cell may be rendered more unstable by an increase in a voltage on the access control line, the design may be such that it is tolerant to this increase in voltage. In such a case, it may be advantageous to increase the voltage level on the access control line for both reads and writes as in the case of reads this will decrease the read time and thereby increase the performance of the device.

In some embodiments, said switching circuitry is configured to connect said capacitor to a supply voltage of said semiconductor memory to charge said capacitor before connection of said capacitor to said selected access control line.

In order to pre-charge the capacitor, it may be connected to the supply voltage of the semiconductor memory. This may be done before any data access requests are received and in this way, there is no timing penalty for charging this capacitor as it is done outside of the timing for the access requests. Furthermore, as the capacitor is isolated from the word line prior to connection thereto, charging in this way does not produce any loading on the word line. Additionally, charging the capacitor in this way can be advantageous as in the charged state when connected to the supply voltage it will act as a decoupling capacitor and help to compensate for fluctuations in the supply voltage.

It is therefore advantageous in some embodiments to charge the capacitor early and to leave it charged until the charge is required to boost the access control lines.

In some embodiments, said switching circuitry is configured to connect said capacitor to ground to discharge said capacitor in response to said control signal from said control circuitry indicating that said voltage level is to be reduced before connection of said capacitor to said selected access control line.

If the capacitor is to be used to reduce the voltage level on the access control line then it is discharged prior to connection to this access control line. In this way, when connected to the capacitor the charge on the access control line will be shared and thus, some will dissipate to the capacitor to render the voltages on the access control line and capacitor equal and the voltage level will thereby be reduced. This will work provided the capacitor and the access control line are isolated from any voltage supply.

In some embodiments, said switching circuitry is configured to connect said capacitor to a selected voltage level to charge said capacitor by a predetermined amount before connection of said capacitor to said selected access control line, said selected voltage level being selected in response to a received tuning signal.

In some embodiments, rather than connecting the capacitor to the supply voltage it may be connected to a selected voltage level that can have a tuned value. By tuning the voltage level in this way, the amount of charge on the capacitor can be controlled and thus, the amount of boost or the amount of reduction supplied to the voltage of the access control line is also controlled. The tuning signal may be a signal generated by the processing system that is currently accessing the memory and it may be based on the processing system's knowledge of operating conditions at the time and thus, its knowledge of the amount of reduction and/or boost in the access control signal that is currently required.

In some embodiments, said control circuitry is configured to change a capacitance of said capacitor in response to a received tuning signal.

Alternatively, the system can be tuned by changing the capacitance of the capacitor. The amount that the voltage level is reduced or boosted will depend on the amount of charge stored on the capacitor which may depend on the voltage level used to pre-charge it but will also depend on the size of the capacitor. Thus, in some embodiments the size of the capacitor can be changed in response to a received tuning signal. This may be done if the capacitor is formed of several elements that may be coupled together or isolated from each other.

In some embodiments, said control circuitry is configured to determine when said access control line connected to said voltage level attains a predetermined value and in response to determining attainment of said predetermined value to control said switching device to isolate said capacitor from a voltage supply and to isolate said access control line from said selected voltage and to connect said capacitor to said access control line.

In order to control the timing of the access there is control circuitry that determines when the access control line obtains a predetermined value and in response to this it isolates the capacitor from its voltage supply and isolates the access control line from the selected voltage and then connects the capacitor to the access control line. In response to this the voltage level changes and the access can be performed. In order for the access not to be unduly delayed this switching should be done as soon as it is determined that the required predetermined voltage level has been attained on the access control line as any delay will defeat the purpose of lowering the voltage for reads or increase the access time for writes. If the switching occurs before the value is attained, then the effect of boosting the voltage is defeated and in the case of the voltage being lowered it may weaken the read more than is intended. It should be noted that determining when the required voltage level is attained may be done with a voltage detector but in many embodiments it is done by detecting a voltage transition and providing a specific delay between the transition and the switching, the delay being selected such that the voltage level attained by the access control line during this delay is the required predetermined voltage level.

In some embodiments, said semiconductor memory comprises a replica access control line replicating an access control line, said control circuitry being configured to connect said replica access control line to said voltage level when connecting said selected access control line to said voltage level, said control circuit being configured to detect a voltage transition on said replica access control line and to provide a predetermined delay between detecting said transition and isolating the access control line from the selected voltage.

In order to determine when the predetermined value has been reached, a replica control line can be used which is also connected to the voltage level. The use of a replica control line means that rather than requiring a detection circuit to detect each access control line, a single detection circuit for detecting voltage transitions on the replica line can be used. This provides a significant saving on area. It should be noted that the detector simply detects a voltage transition and then provides a delay circuit to provide a suitable delay between this detected transition and the isolation of the word line from the voltage supply line, that is sufficient to cause the voltage level on the word line to have reached the desired value.

In some embodiments, said control circuitry is configured to select said predetermined value in response to a received tuning signal.

An alternative way of tuning the circuit is to select the predetermined value that the voltage level of the access control line attains before connecting the capacitor to it with the use of a tuning signal to indicate this value. In this way, the final level attained by the signal following the boost or reduction due to connection to the capacitor can be controlled.

In some embodiments, said control circuitry is responsive to receipt of a control signal to inhibit said access control circuitry from changing a voltage level supplied to said selected access control line, such that in response to a data access request, said control circuitry: connects said selected access control line to said voltage level to allow access to said selected storage cell; and maintains said access control circuitry isolated from said selected access control line.

Owing to the construction of the control circuitry, it is possible to inhibit it from changing the voltage levels supplied to the access control line if required. Thus, in response to receipt of a control signal indicating that no change in voltage is required, the control circuitry does not connect the capacitor to the access control line, but leaves it isolated from it. A signal indicating that no change in voltage is required may be generated by the processing system using the memory when it realizes that the memory is operating within conditions where the access control line does not need any boost or any reduction in voltage levels to operate correctly. As any variations in the voltage level on the access control line generated by the capacitor will add to the power consumed by the device it is advantageous if when these changes in voltage level are not required, they are inhibited. In this way the performance of the memory can be improved. As the access control circuitry has a capacitor that is generally isolated from the access control line and is only connected during the access it is a simple matter to inhibit its operation.

In some embodiments, said control circuitry is responsive to a receipt of a control signal to inhibit said access control circuitry from changing a voltage level supplied to said selected access control line to control said switching circuitry to connect said capacitor to a supply voltage of said semiconductor memory.

Even when inhibited from changing the voltage level on the access control lines, the access control circuitry can have a positive influence on the memory by charging the capacitor and coupling it to the supply voltage so that it acts as a decoupling capacitor and helps maintain the stability of the supply voltage without adding any loading to the word line.

Although the semiconductor memory can have a number of forms, in some embodiments it comprises an SRAM memory, said groups of access devices and corresponding storage cells comprising a row of said SRAM memory and said access control line comprising a word line.

DESCRIPTION OF EXAMPLE, NON-LIMITING EMBODIMENTS

Figure 1:
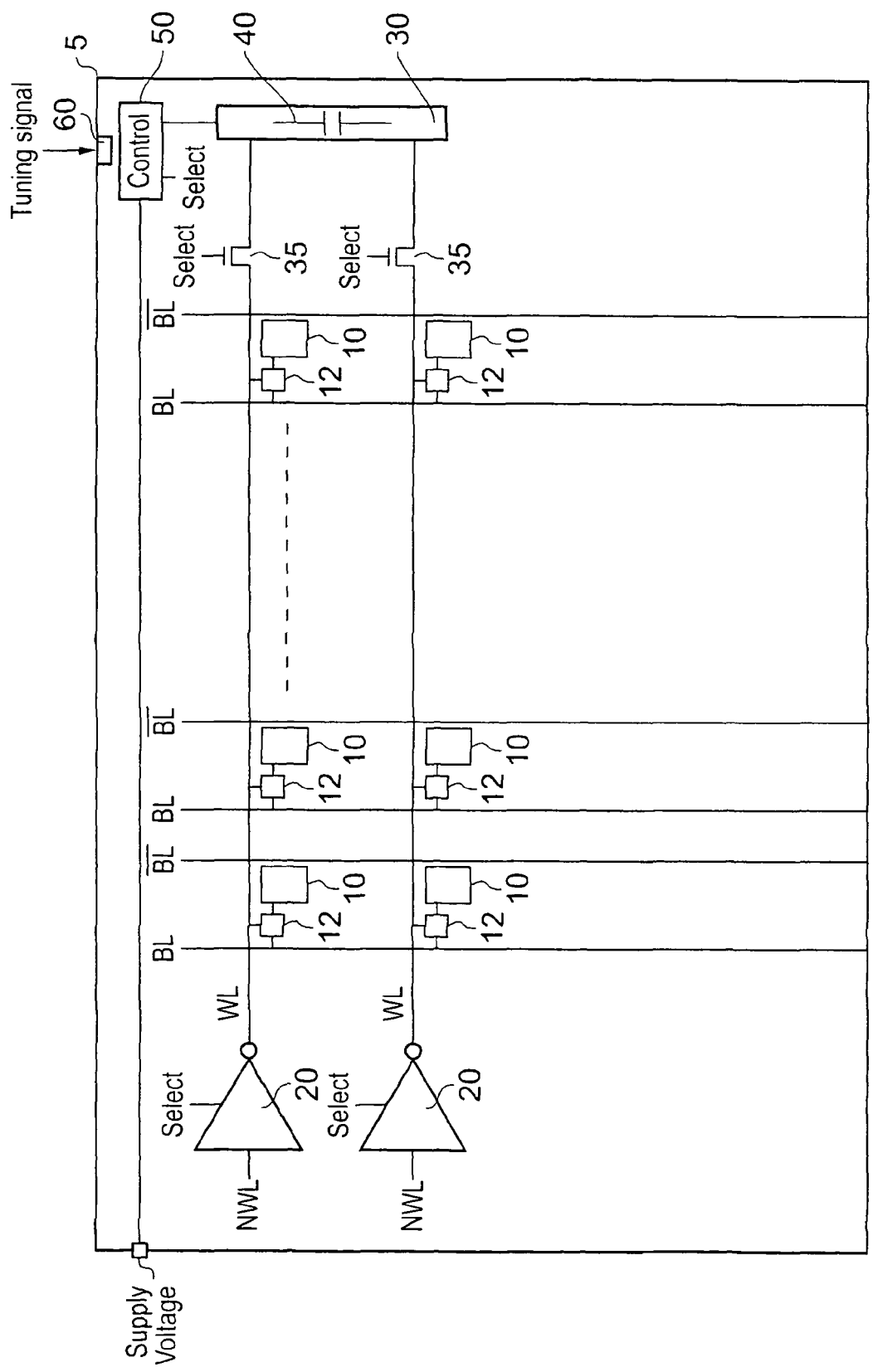
FIG. 1 shows a memory according to an example, non-limiting embodiment.

FIG. 1 shows a memory 5 according to an example, non-limiting embodiment. Memory 5 comprises a plurality of data storage cells 10 arranged in an array, each cell having access devices 12 controlling access to these storage cells. In this embodiment the memory is arranged as an array and requests to access data, access a selected row of the array via word lines WL.

In order to access a data storage cell 10 specified by a data access request a driver 20 on the relevant word line will be selected and it will power the word line to raise the voltage such that the access device 12 for cell 10 is turned on and access to the cell 10 via this device is provided. In this embodiment the memory is a SRAM memory with word lines and bit lines and complementary bit lines.

Memory 5 also comprises access control circuitry 30 which acts to change the voltage level supplied to the word line in response to a data access request in order to facilitate access to the storage cells.

In the case of a request to write to a storage cell, then the request must be sufficient to switch the state stored in the cell if required and this can be difficult, particularly at low operating voltage levels. In order to ensure that the write is able to function correctly, access control circuitry 30 provides a boost to the voltage level on the word line signal in response to a write request and this boost enables the state in the access storage cell to switch.

In this embodiment, access control circuit 30 is schematically shown as providing voltage level control to two word lines. The word line containing the cell to be accessed is selected via the select signal on the switching transistor 35. Thus, a single access control circuit 30 can be used to provide voltage level control for a plurality of word lines which makes embodiments very area efficient.

Although in this embodiment access control circuit 30 is only shown as providing voltage control to two word lines, in some embodiments it can provide it to many more. The factor which controls the number of word lines to which a single access control circuit can provide voltage control, is the size of the capacitor 40 within the access control circuit as compared to the size of the capacitance of the word lines themselves. This will be explained in more detail with respect to later figures.

In addition to providing a boost to the voltage level on the word line, the access control circuitry 30 can also be used to reduce the voltage level on the word line if this is required.

Whether access control circuitry 30 provides a boost or a reduction in voltage level is controlled by control circuitry 50. It may be that in some circumstances such as when performing a read, the voltage level is reduced during the data access. During a read it is important that the state of the storage cells 10 on the accessed word line are not corrupted by the access signal, and thus, an access signal with a lower voltage level may be preferable.

There may also be circumstances where the memory is operating under conditions where accesses can be made correctly without any need to boost or reduce the voltage levels. In such cases, control signal 50 inhibits access control circuitry 30 from connecting the capacitor 40 to the word lines during data accesses such that the access control circuitry 30 does not affect the voltage levels during these data accesses.

The memory 5 of FIG. 1 also comprises a tuning signal input 60 which receives a tuning signal from a processor that accesses the memory. This tuning signal provides information to control circuit 50 regarding whether the voltage level needs increasing, reducing or should not be altered. It may also provide information on the amount that the voltage level should be changed by.

Figure 2:
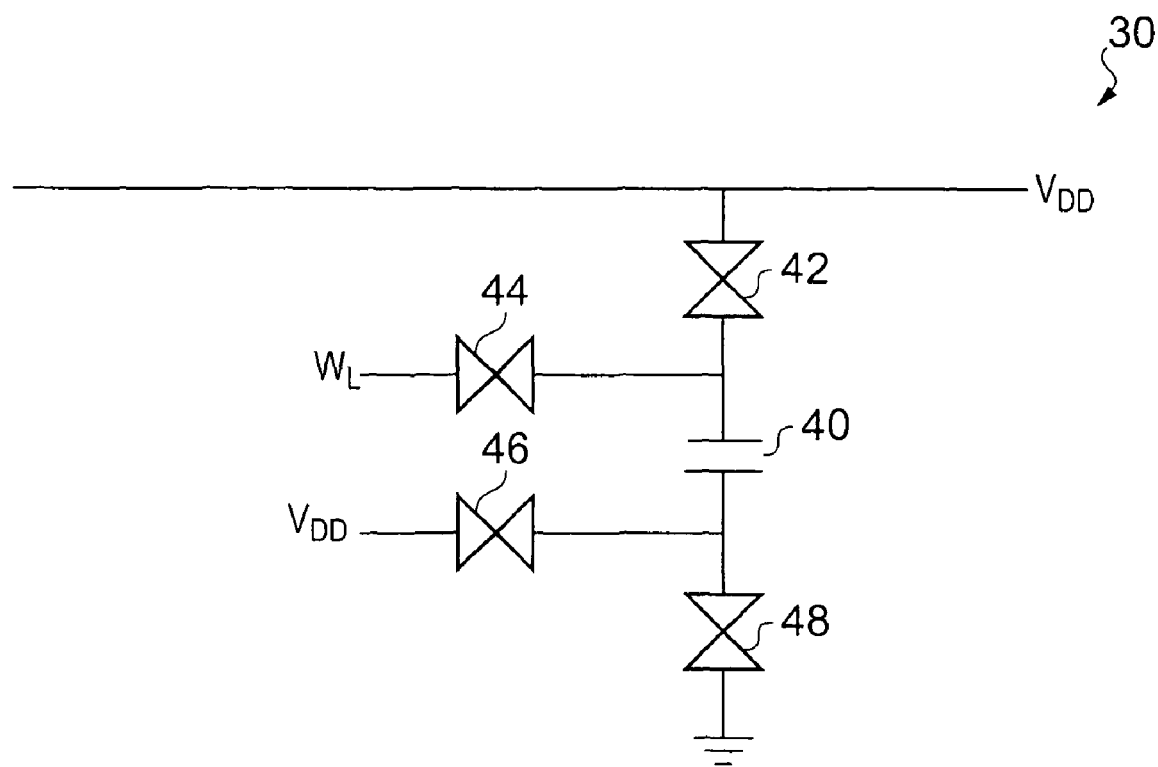
FIG. 2 schematically shows access control circuitry according to an example, non-limiting embodiment.

FIG. 2 shows in schematic form access control circuitry 30. Access control circuitry 30 comprises capacitor 40 and a plurality of switches 42, 44, 46 and 48. In pre-charge mode switches 42 and 48 are switched on and charge flows from supply line VDD to capacitor 40 and charges it. When the world line WL fires switches 42 and 48 are turned off and switches 44 and 46 are turned on. The charge held on capacitor 40 is then coupled to the word line via switch 44 and this provides a boost to the voltage level on the word line.

Where a reduction in voltage level on the word line WL is required capacitor 40 is discharged via switch 48 before the data access occurs. Then, in response to the word line firing the discharged capacitor 40 is connected via switch 44 to the word line and charge sharing between the word line and the capacitor 40 occurs and the voltage level on the word line is reduced.

Figure 3A:
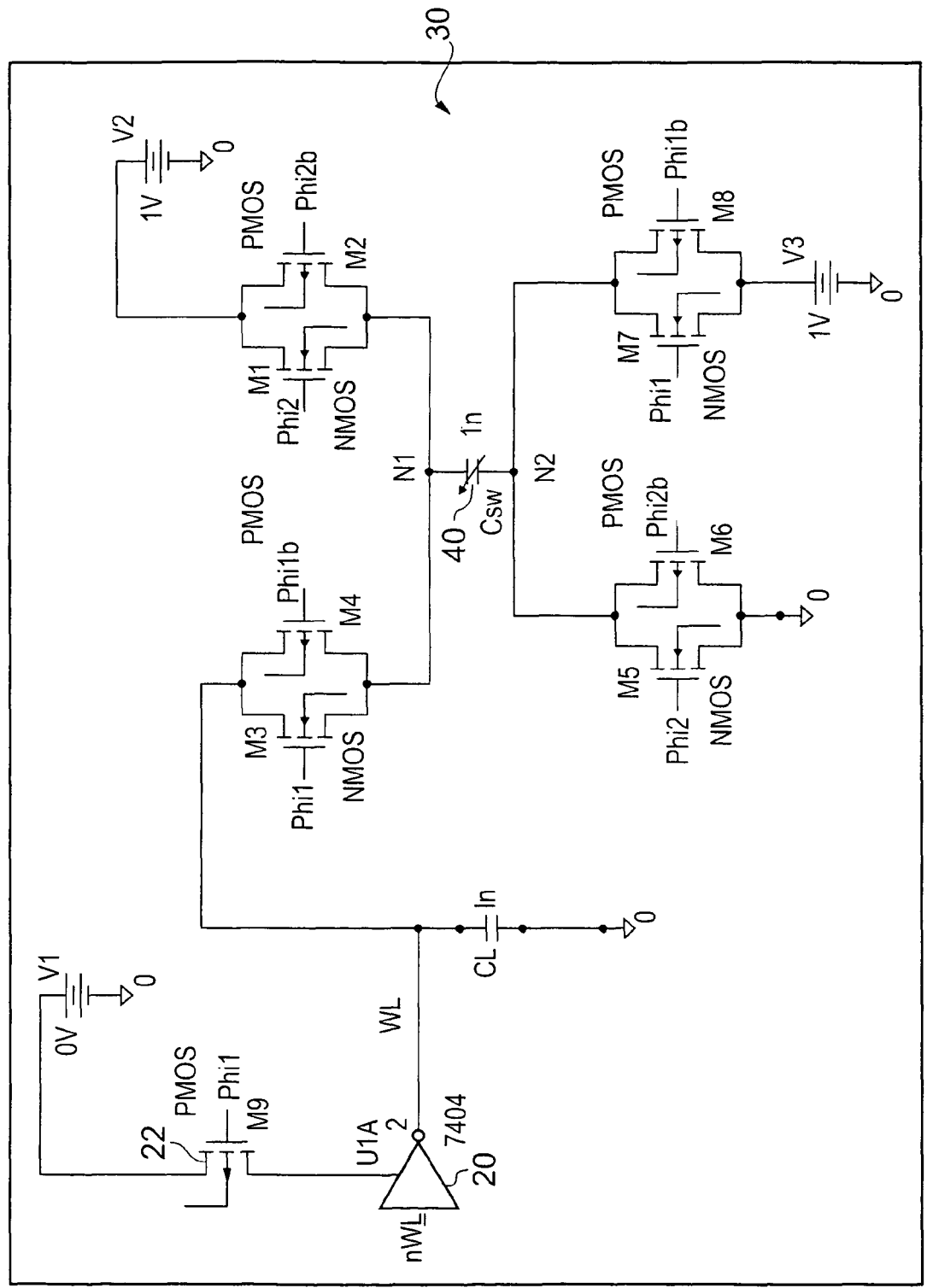
FIG. 3A shows access control circuitry and word line drivers according to an embodiment of the present invention.

FIG. 3A shows an example embodiment of access control circuitry such as that shown in FIG. 2. In this embodiment the switching circuitry is shown in more detail and the word line and word line driver 20 are also shown. Thus, the access control circuit 30 and the word line driver 20 are controlled by two signals PHI1 and PHI2. These signals are phase signals that are used to manage the charging of the capacitor and the charge sharing in order to achieve the desired voltage change on the word line to allow increased gate overdrive or reduced gate overdrive during a write or a read operation.

The circuit operates as follows, when the memory is idle the signals PHI2 and PHI2B are active, asserted and signals PHI1 and PHI1B are inactive, de-asserted. This allows the capacitor 40 to charge through the pass transistors M1, M2 (which correspond to switch 42 of FIG. 2) through nodes N1, N2 and through pass transistors M5, M6 (which correspond to switch 48 of FIG. 2) so that the voltage at the capacitor 40 is held at a particular voltage illustrated as V2 and which is generally the supply voltage VDD.

Figure 3B:
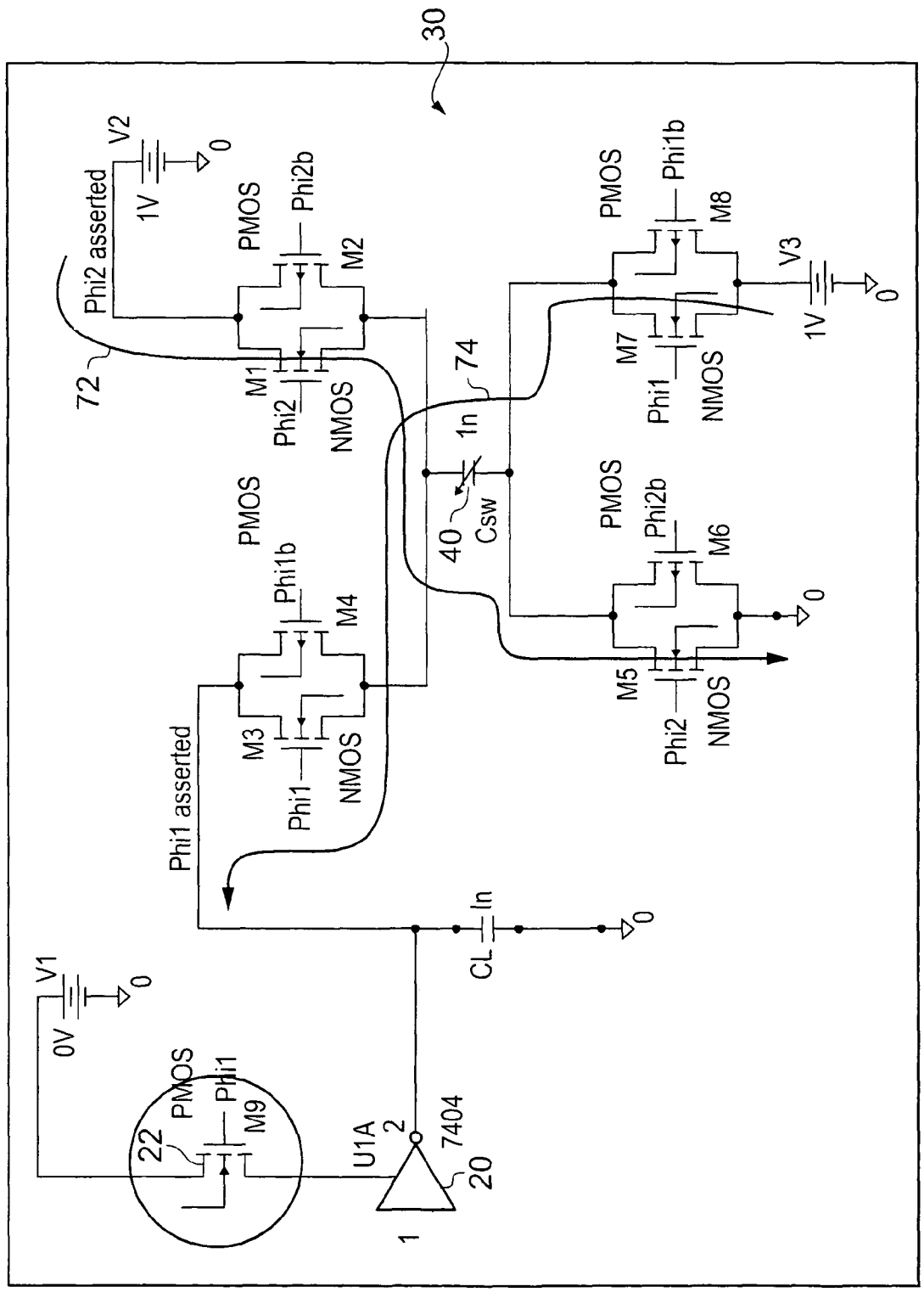
FIG. 3B shows the transmission of charge during operation of the circuit of FIG. 3A.

The operation of the circuit of FIG. 3A is shown in FIG. 3B. When PHI2 and PHI2B are asserted and PHI1 and PHI1B are de-asserted, in the pre-charging phase then charge flows to the capacitor via arrow 72. When the word line fires and has attained a voltage level equal to V2 which may be set to the supply voltage VDD or may be set lower if the circuit is to be tuned using this voltage and it is desired to reduce the voltage boost, PHI1 is de-asserted and PHI2 is asserted. There should be no overlap between the de-assertion of PHI1 and the assertion of PHI2 to avoid losing charge that has developed on capacitor 40 during the switching. When PHI1 is asserted charge flows along arrow 74 to word line WL and the voltage on the word line is raised to a voltage that depends on the capacitance CSW of the capacitor 40 and the capacitance CL of the node on the word line. The rise in the voltage will be equal to VDD (1+CSW)/(CSW+CL) if the capacitor has charged to VDD. Thus, the amount that the voltage is raised by depends on the capacitance of capacitor 40 and the capacitance of the word line and also the voltage that the word line is raised to before PHI1 is de-asserted. In this case the rise in voltage would be equal to VDD+V2(CSW/(CSW+CL)).

Where control circuitry is controlling several word lines then the capacitance CL of the word line will increase and this limits the number of word lines that access control circuitry 30 can control as when the capacitance CL seen at the node reaches a value that is significantly greater than the capacitance CSW of the capacitor 40 then the voltage increase that capacitor 40 provokes will be small.

The assertion of PHI1 is also used to cut off the word line node from the supply voltage by turning off the word line driver 20 via switch 22. This ensures that charge sharing between the capacitance CL of word line WL and the capacitance CSW of capacitor 40 occurs.

It should be noted that the rise in voltage is equal to VDD (1+CSW)/(CSW+CL) where the word line and the capacitor are charged to VDD.

The same principle can be applied to reduce the voltage on the word line WL to allow for reduced gate overdrive. Thus, this single circuit 30 can not only control a voltage increase on a plurality of word lines, it can also control a voltage reduction if that is desired. In order to reduce the voltage, the sharing can be set up such that in the first phase (PHI2 asserted) capacitor 40 is discharged to a lower voltage. This may be zero volts or it may be set up to have a predetermined low voltage as will be seen with respect to later figures. When the voltage of the word line is raised, PHI1 is asserted and switch 22 is turned off to disconnect the word line from the supply voltage and charge sharing occurs such that the voltage level on the word line settles to VDD (CL/(CL+CSW)). Thus, in this way the capacitor 40 can be used to reduce the voltage level on the word line as well as increasing it by controlling the amount of charge the capacitor holds prior to the data access request being processed.

One thing to bear in mind is that an increase in the voltage on the word line during data access increases the write margin but also increases the read disturb margin. In other words, there is more likelihood that the storage cells in the word line that is accessed and that are not being written to will be disturbed if the voltage level on the word line is increased during a write.

Figure 4:
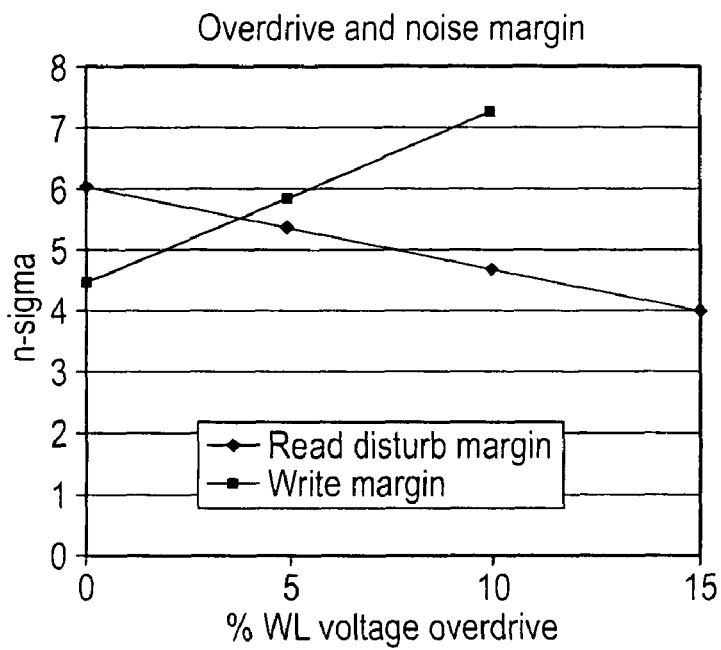
FIG. 4 shows the variation in the read disturb margin and the write margin with respect to the percentage of word line voltage overdrive.

FIG. 4 shows a graph illustrating the change in write margin and read disturb margin with respect to the increase in voltage on the word line. Thus, it can be seen that increasing the word line voltage increases the write margin but also affects the read disturb margin and there is therefore a limit to the amount that the level of voltage on the word line should be increased and control of this value is important in ensuring that the memory operates correctly. It should be noted that during a read as the value stored in the cell is not overwritten a reduction in the voltage on the word line during a read access can be implemented to lower the probability of the value stored being disturbed. However, it should be noted that this has the drawback of reducing the speed of the memory access. Therefore, if the cells have been designed such that they are stable in response to a write access which has had its voltage level increased by a known amount, it may be advantageous to increase the voltage level by this amount during the read as well as this will increase the speed of the data access and improve the memory performance.

As can be seen there are various factors such as the operating voltage of the memory and its components, that affect how much it is desirable to increase or reduce the voltage level on the word line by. It is therefore advantageous if this level can be set. Thus, providing the circuit with a tuning ability such that the change in voltage level can be tuned in response to a tuning control signal is advantageous. There are different ways in which the change in voltage level can be tuned and these involve either selecting a particular size of capacitance, charging the capacitance to a particular voltage or changing the voltage level that the word line has attained before implementing the boost or reduction mechanism.

Figure 5:
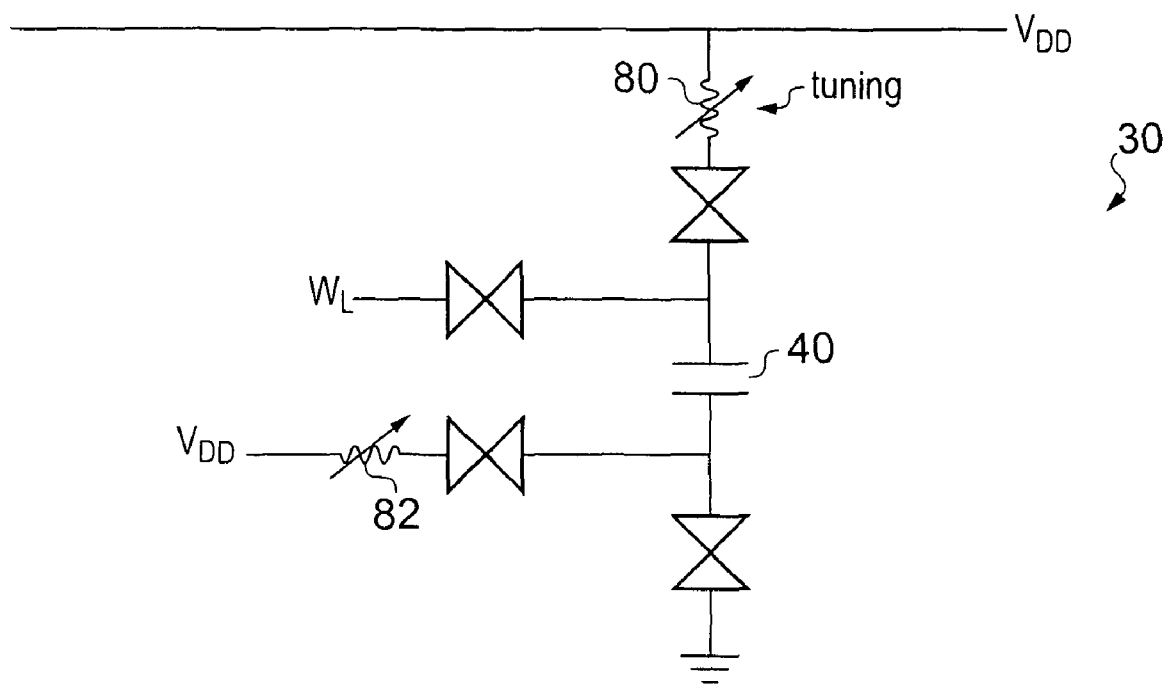
FIG. 5 shows access control circuitry where the voltage level that the capacitor is charged to is tunable.

FIG. 5 shows in schematic form access circuitry 30 similar to that of FIG. 2 but with the ability to tune the voltage level that capacitor 40 is charged to, such that the amount of charge that the capacitor 40 holds can be varied and thus, the boost or reduction to the word line voltage supplied by this capacitor 40 can be controlled. In this embodiment, the tuning circuitry comprises variable resistor circuits 80 and 82 which are used to control the voltage seen by capacitor 40. In all other respects, the circuit operates in the same way as the circuit of FIG. 2, it is simply that the amount of charge held by capacitor 40 is controllable and thus, in response to the tuning signal the increase or reduction in voltage that this circuit supplies to the word line can be varied.

Figure 6:
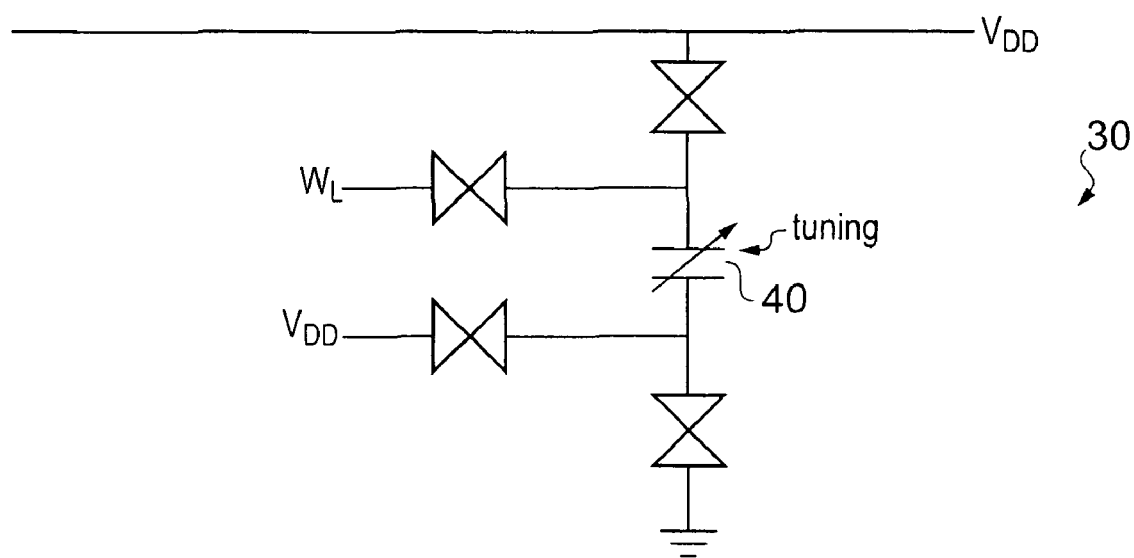
FIG. 6 shows access control circuitry where the value of the capacitance of the capacitor is tunable.

FIG. 6 shows an alternative embodiment where the tuning is provided by a variable capacitor such that the capacitance of this capacitor can be altered in response to a tuning signal and this changes the amount that the voltage level is boosted or reduced by.

Figure 7:
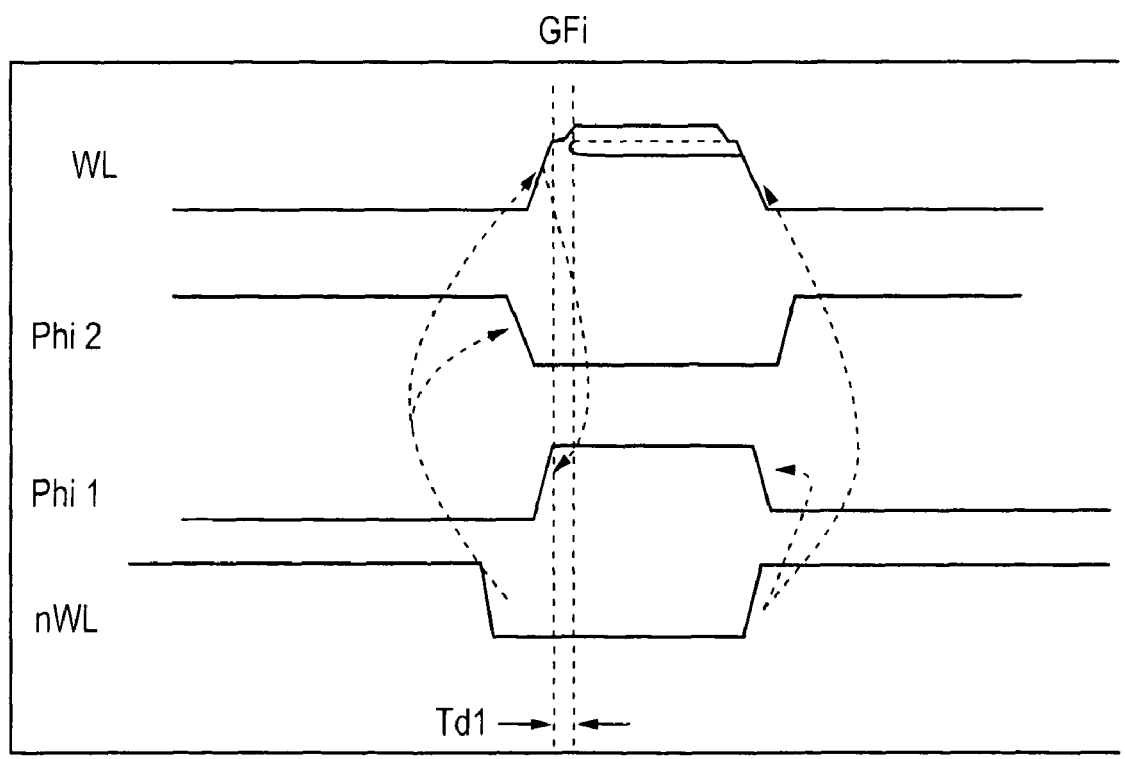
FIG. 7 shows a timing diagram illustrating how the voltage on the word line varies with the control signals controlling the switching devices.

An alternative way of controlling the amount of change in voltage that circuitry 30 supplies to the word line is to control when the capacitor 40 is connected to the word line and when the word line is disconnected from its supply voltage. If the word line is disconnected from its supply voltage before it has attained the voltage level of the supply voltage then clearly the boosted value will be lower than if the boost was supplied once the word line had attained the value. FIG. 7 shows a timing diagram showing the control signals PHI1 and PHI2 and the value of voltage on the word line. This diagram shows that when PHI1 is asserted too early and a voltage boost is being supplied, the effect of this boost is defeated. Furthermore, if it is asserted too early and a reduction in voltage is required, then this might weaken the read more than needed. On the other hand, asserting it with a fixed time delay might cause the effect to occur late resulting in an extended word line pulse for write or defeating the purpose of lowering the voltage during read and having a detrimental effect on the memory performance.

In order to determine an appropriate time to assert the PHI1 signal it is advantageous to detect the voltage level reached on the node WL and when it has attained the required value then PHI1 can be asserted.

Such a voltage detector can be used to ensure correct timing of the PHI1 signal. It can also be used when tuning the circuit by varying the voltage level that the word line has attained in order to vary the final boosted or reduced value to be the level required.

Figure 8:
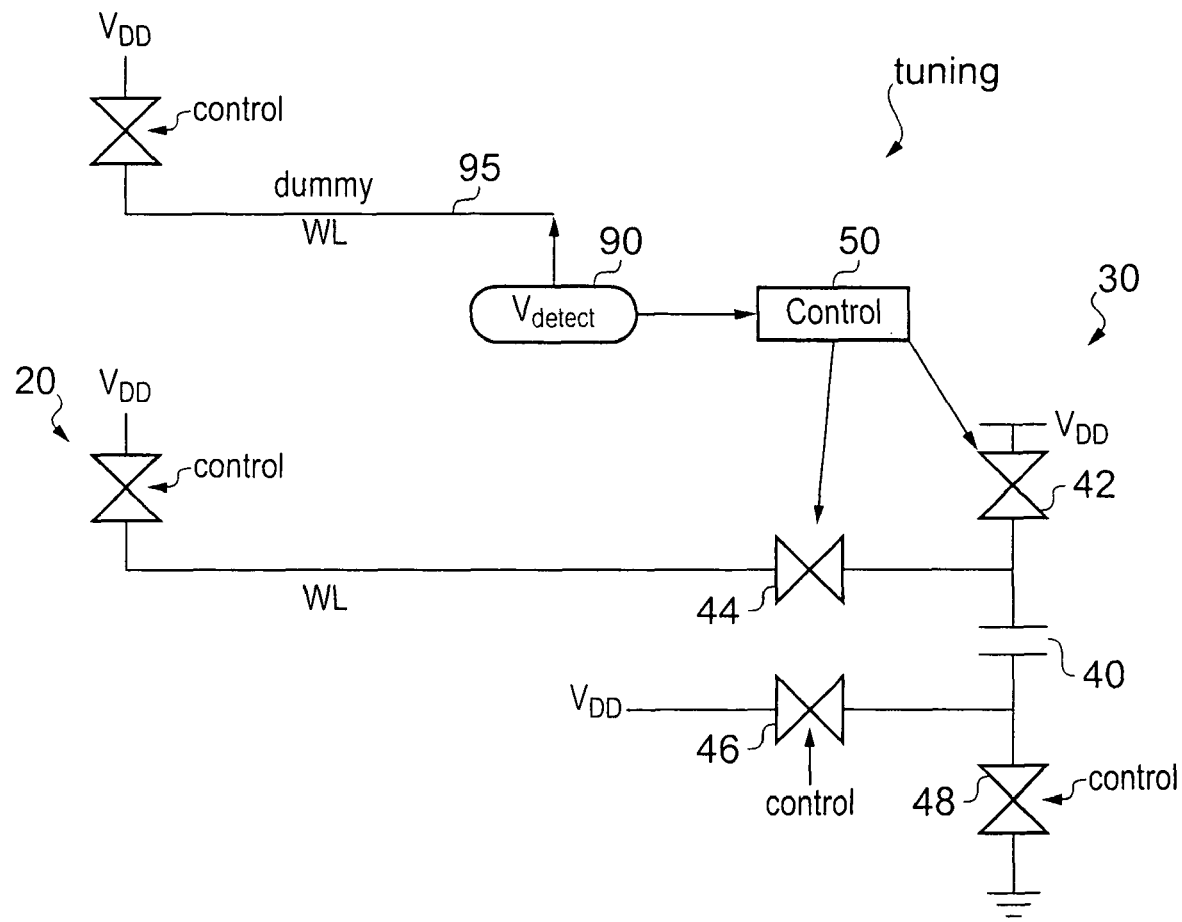
FIG. 8 shows access control circuitry and word lines that are tuneable according to an example, non-limiting embodiment.

FIG. 8 shows a schematic diagram illustrating access control circuitry 30 controlled by voltage detector 90. In this embodiment a dummy word line 95 is formed that replicates the word lines within the memory 5. This dummy word line is controlled in the same way as the actual word line and thus, it is connected to the supply voltage by the same control signal and the voltage level rises in the same way as the voltage level on the word line. Voltage detector 90 detects the rise in voltage level on the dummy word line 95 and on detecting it reaching a desired value it sends a control signal to control circuit 50 which controls the switching circuits within access control circuitry 30 and word line driver 20.

The desired value stored in voltage detector 90 can be set in response to a tuning signal received from the processor that is accessing the memory and in this way the boosted or reduced level of the voltage can be controlled. The timing of the signals is also controlled by this tuning signal.

A dummy word line is used to mimic the behaviour of a real word line as in this way only one voltage detector 90 is required to detect transitions on this dummy word line, rather than multiple detectors being required to detect the voltage rise on multiple word lines. The detection of this transition is used to control the timing of the system.

A transition of the voltage on the dummy word line can be detected and as the transition on the selected word line will either occur at the same time or a known time earlier or later, it can be estimated when the word line will have reached the supply voltage and the switching should occur. Thus, the switching can be controlled to occur a certain time after the dummy word line transitions. This control in the timing can also be used to tune the system as is described in below.

If the characteristics of the rise in voltage of the word line are known then by changing the delay between when the dummy word line either transitions or attains a predetermined value and when the signal is sent to control circuit 50 to control the switching, the level that the word line voltage has attained when the switching occurs can be controlled and thus, the final value of the voltage level attained can be tuned. This delay can be controlled by sending the output of the voltage detector via a tunable delay chain to the control circuit. Tuning of the circuit in this way can be advantageous in a compiler environment for example, where the wordline load is variable and thus, the required overdrive also varies.

At the controlled switching point signal PHI2 is de-asserted and signal PHI1 is asserted and the capacitor 40 is then connected to the word line and this either reduces or raises its voltage level depending on the charge stored on the capacitor 40.

It should be noted that in addition to tuning the circuit, control circuitry 50 for example can be used to inhibit switches 44 and 46 from opening and to open switches 42 and 48 when it detects a tuning signal that indicates that the memory is operating in a region where it needs no boosting or reduction of the voltage on its word line to successfully access the memory. In such a case, capacitor 40 acts as a decoupling capacitor being charged and connected to supply voltage VDD and this helps to compensate for any voltage variations in the supply voltage. Furthermore, as switch 44 is open no load is provided on the word line by capacitor 40. Thus, owing to the arrangement of this system it can be simply disconnected from the word line and will function as a decoupling capacitor thereby improving the performance of the system. It is advantageous to stop the reduction or increase in voltage level if it is not required as each time this voltage level is altered by capacitor 40 some charge is lost and the power consumption of the memory therefore increases.

It should also be noted that switch 22 can also be used as a power switch.

Figure 9:
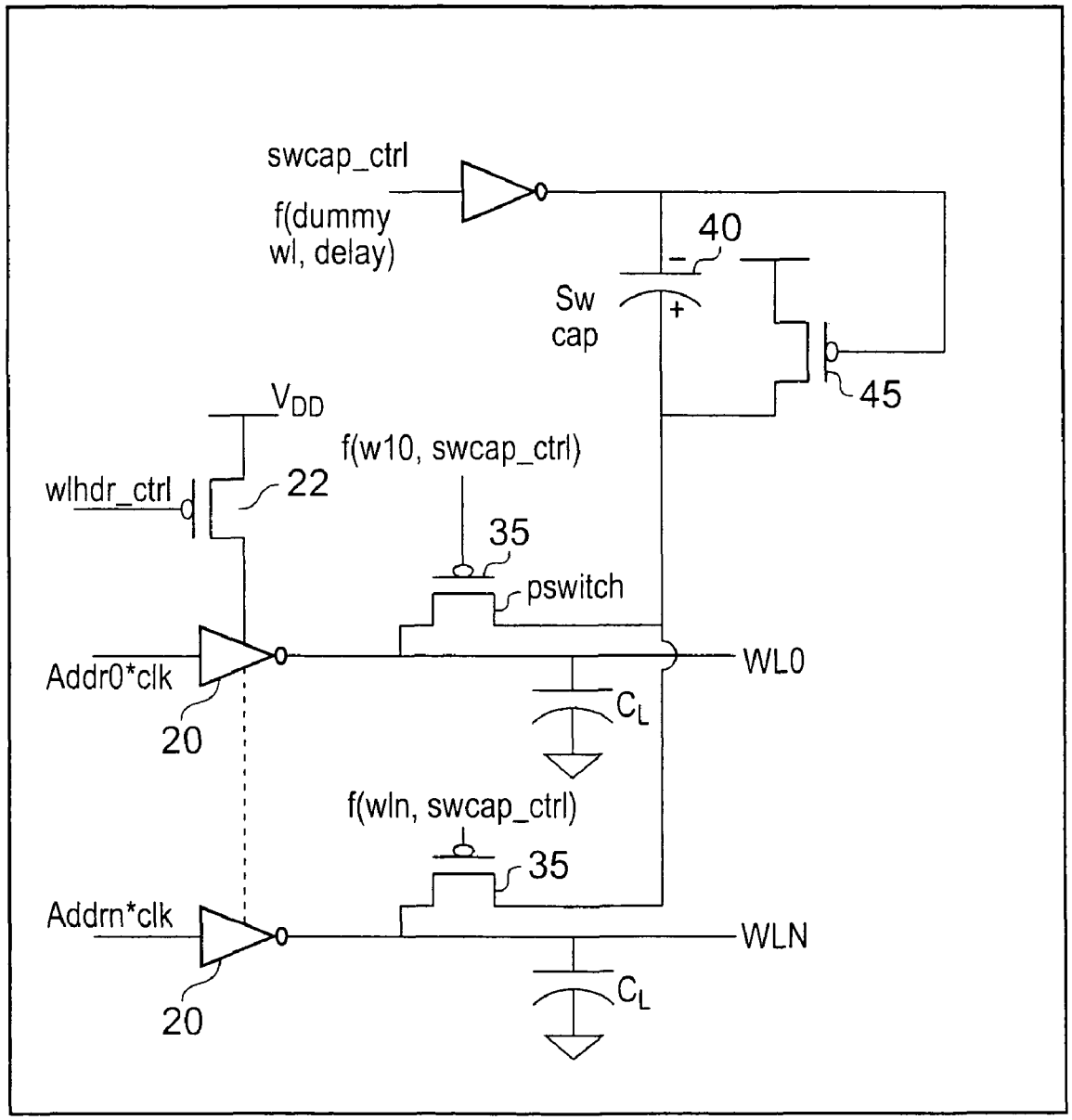
FIG. 9 shows multiple word lines and access control circuitry controlled by a detected voltage on a dummy word line according to an example, non-limiting embodiment.

FIG. 9 schematically shows multiple word lines and their connection to capacitor 40. It also shows an input from a dummy word line which controls the delay at which the switches switch. Thus, there are multiple word lines WL0 . . . WLn which are selected in response to an address signal received at word line drivers 20. Switch 22 switches the selected word line driver such that VDD is supplied to the word line from the supply voltage line VDD. There are additional switches 35 that are used to connect the selected word line to capacitor 40 following the word line attaining the desired voltage level. There is also a switch 45 used to charge the capacitor 40 to the desired voltage level, this switch being switched off prior to switches 35 being switched on.

Figure 10:
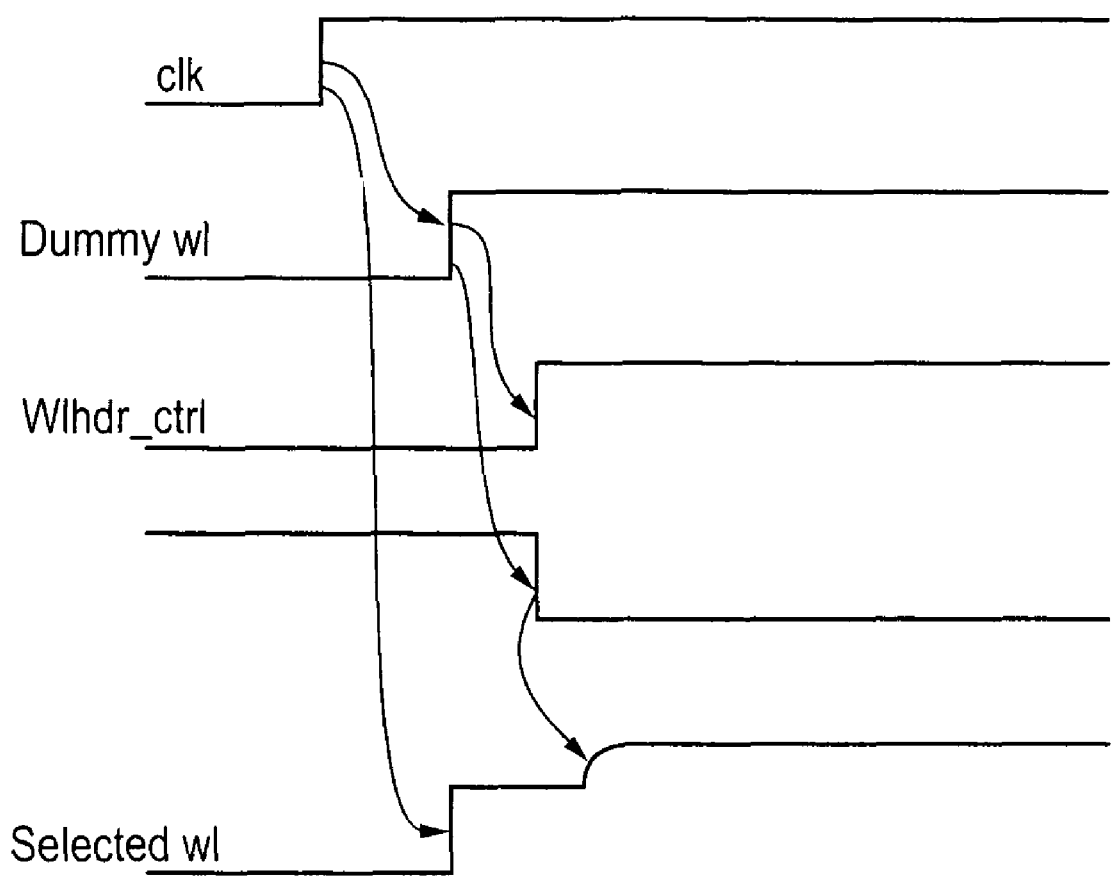
FIG. 10 shows a timing diagram of the circuit of FIG. 9.

FIG. 10 shows a timing sequence in the voltage overdrive example of FIG. 9. As can be seen in response to the clock signal the selected word line is charged. The dummy word line is also charged and after the calculated delay a control signal is sent to switch 22 that applies the voltage via word line driver 20 to the selected word line. The signal on this word line is then boosted in response to switch 35 switching and the charge from capacitor 40 flowing onto the word line.

Figure 11:
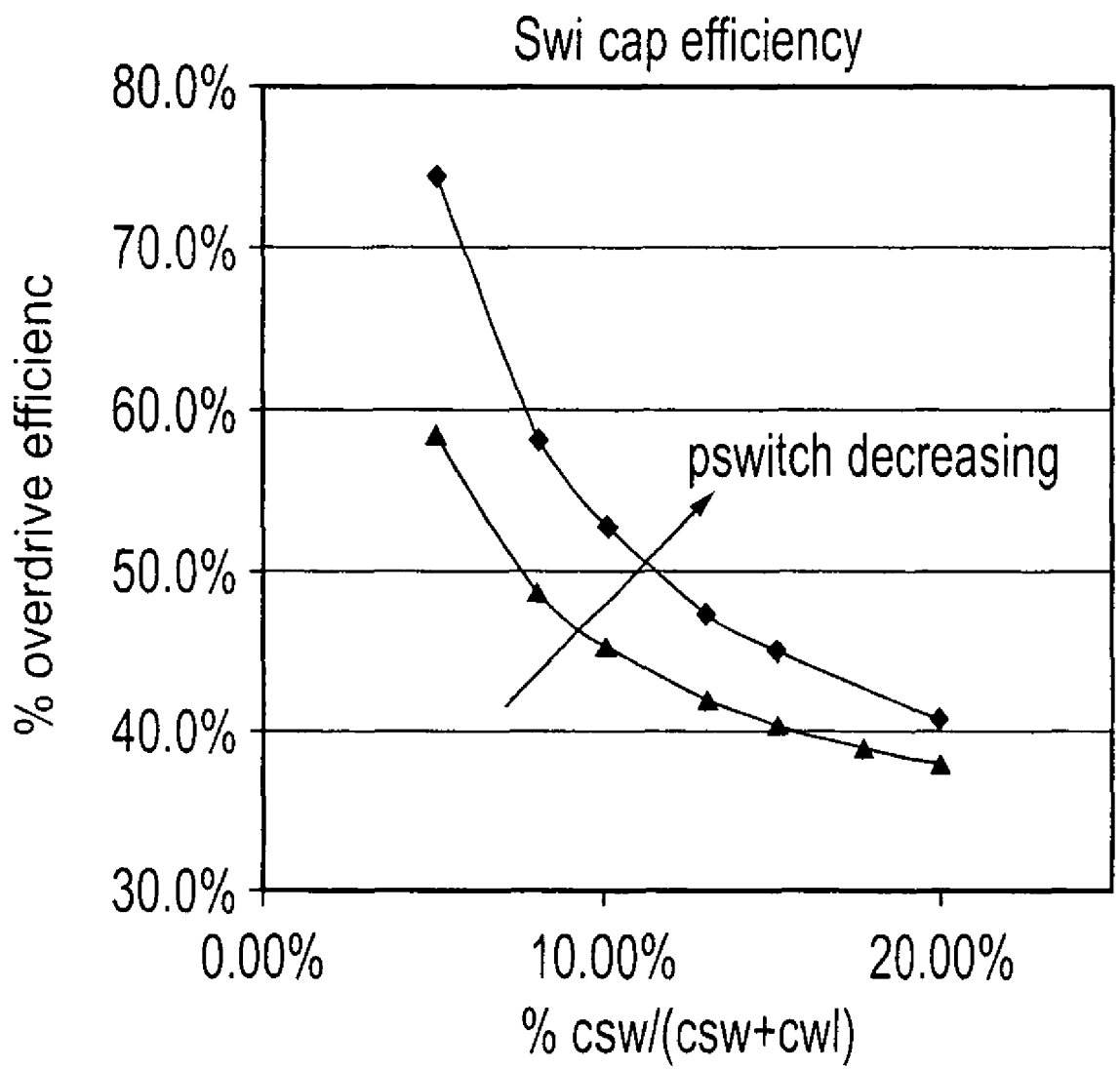
FIG. 11 shows overdrive efficiency as a percentage of the capacitor size.

FIG. 11 shows a graph illustrating how the efficiency of the switching of the memory increases with the boost to the voltage. This figure shows the overdrive efficiency related to the percentage of switch capacitor value compared to the total capacitance of the word line and switch capacitor. This varies with the delay in the switch connecting the capacitor to the word line to apply the boost or overdrive decreasing for a 16 word line driver. As can be seen this method is very efficient for a small amount of overdrive and furthermore, in this embodiment the switch capacitor is shared amongst 16 word line drivers.

Figure 12:
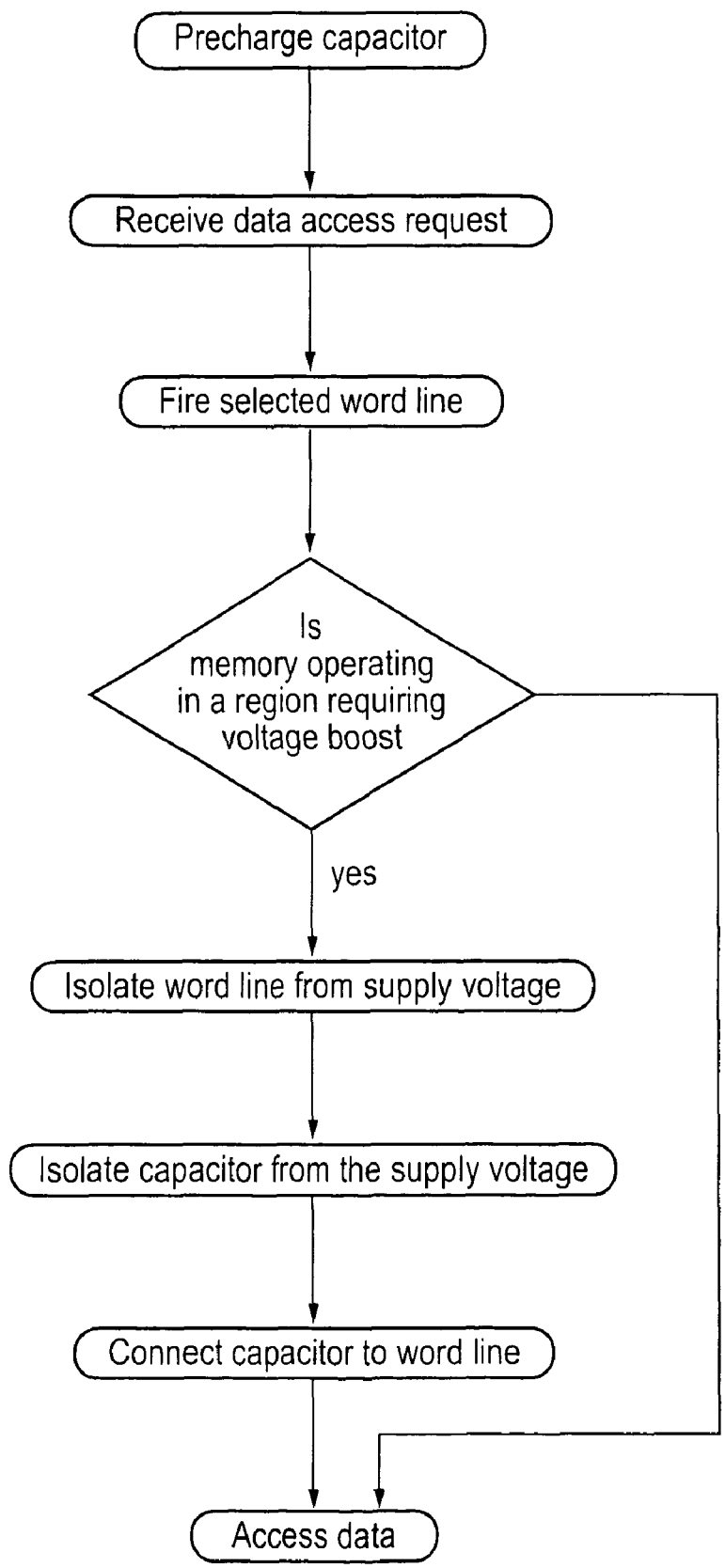
FIG. 12 shows a flow diagram illustrating steps in a method according to an example, non-limiting embodiment.

FIG. 12 shows a flow diagram illustrating a method according to an example, non-limiting embodiment. This method involves boosting the word line to improve the success of write requests. Initially the capacitor in the access control circuitry is pre-charged. This capacitor can hold its charge and act as a decoupling capacitor while the memory is inactive. Once a data access request is received then the selected word line is fired. It is then determined if the memory is operating in a region that requires a voltage change to improve write success. If it is then the word line is isolated from the supply voltage and the capacitor is isolated from the supply voltage. The capacitor is then connected to the word line to provide a boost in voltage and the data is accessed. If the memory is not operating in a region requiring a voltage boost then the data is simply accessed and the capacitor is not connected to the word line and remains charged and acting as a decoupling capacitor for the supply voltage.

This method shows the steps that occur when the word line voltage is boosted to improve a write. As noted earlier the capacitor and access control device can also function to reduce the voltage level on the word line in response to a read. In such a case the capacitor is discharged initially and then the same steps occur but rather than boosting a voltage the discharge capacitor will act to reduce the voltage level on the word line thereby decreasing the probability of a read disturb occurring.

Although illustrative embodiments have been described, in detail herein with reference to the accompanying drawings, it is to be understood that the claims are not limited to those precise embodiments, and that various changes and modifications can be effected therein by one skilled in the art without departing from the scope and spirit of the appended claims.

We claim:

1. A semiconductor memory storage device comprising:
a plurality of storage cells for storing data;
a plurality of access devices for allowing access to said corresponding plurality of storage cells, said plurality of access devices being arranged in at least two groups, access to each of said at least two groups being controlled by an access control line;
access control circuitry configured to control a voltage level supplied to a selected one of at least two of said access control lines during access to said storage cell, said access control circuitry comprising a capacitor and switching circuitry; and
control circuitry responsive to a data access request to access a selected storage cell to:
connect a selected one of said access control lines to a voltage level to allow access via one of said access devices to said selected storage cell; and
control said switching circuitry of said access control circuitry to connect said capacitor of said access control circuitry to said selected access control line and thereby change said voltage level supplied to said selected access control line.

2. A semiconductor memory according to claim 1, wherein said access control circuitry is configured to change said voltage level supplied to said selected access control line to either increase said voltage level or decrease said voltage level in dependence upon a control signal from said control circuitry.

3. A semiconductor memory according to claim 2, wherein said data access request comprises one of a read request to read data from said storage cell or a write request to write data to said storage cell, said control circuitry being configured to control said access control circuitry to reduce said supplied voltage level in response to said data access request being a read request and to increase said supplied voltage level in response to said data access request being a write request.

4. A semiconductor memory according to claim 1, wherein said data access request comprises one of a read request to read data from said storage cell or a write request to write data to said storage cell, said control circuitry being configured to control said access control circuitry to increase said supplied voltage level in response to said data access request being a read request or a write request.

5. A semiconductor memory according to claim 1, wherein said switching circuitry is configured to connect said capacitor to a supply voltage of said semiconductor memory to charge said capacitor before connection of said capacitor to said selected access control line.

6. A semiconductor memory according to claim 2, wherein said switching circuitry is configured to connect said capacitor to ground to discharge said capacitor in response to said control signal from said control circuitry indicating that said voltage level is to be reduced before connection of said capacitor to said selected access control line.

7. A semiconductor memory according to claim 1, wherein said switching circuitry is configured to connect said capacitor to a selected voltage level to charge said capacitor by a predetermined amount before connection of said capacitor to said selected access control line, said selected voltage level being selected in response to a received tuning signal.

8. A semiconductor memory according to claim 1, wherein said control circuitry is configured to change a capacitance of said capacitor in response to a received tuning signal.

9. A semiconductor memory according to claim 1, wherein said control circuitry is configured to determine when said access control line connected to said voltage level attains a predetermined value and in response to determining attainment of said predetermined value to control said switching device to isolate said capacitor from a voltage supply and to isolate said access control line from said selected voltage and to connect said capacitor to said access control line.

10. A semiconductor memory according to claim 9, wherein said semiconductor memory comprises a replica access control line replicating an access control line, said control circuitry being configured to connect said replica access control line to said voltage level when connecting said selected access control line to said voltage level, said control circuit being configured to detect a voltage transition on said replica access control line and to provide a predetermined delay between detecting said transition and isolating the access control line from the selected voltage.

11. A semiconductor memory according to claim 9, wherein said control circuitry is configured to select said predetermined value in response to a received tuning signal.

12. A semiconductor memory according to claim 1, wherein said control circuitry is responsive to a receipt of a control signal to inhibit said access control circuitry from changing a voltage level supplied to said selected access control line, such that in response to a data access request, said control circuitry is configured to:
  connect said selected access control line to said voltage level to allow access to said selected storage cell; and
  maintain said access control circuitry isolated from said selected access control line.

13. A semiconductor memory according to claim 12, wherein said control circuitry is responsive to a receipt of a control signal to inhibit said access control circuitry from changing a voltage level supplied to said selected access control line to control said switching circuitry to connect said capacitor to a supply voltage of said semiconductor memory.

14. A semiconductor memory according to claim 1, said semiconductor memory comprising an SRAM memory, said groups of access devices and corresponding storage cells comprising a row of said SRAM memory and said access control line comprising a word line.

15. A method of accessing a storage cell within a semiconductor memory storage device comprising, where said semiconductor memory storage device includes:
  a plurality of storage cells for storing data, and a plurality of access devices for allowing access to said corresponding plurality of storage cells, said plurality of access devices being arranged in at least two groups, each of said at least two groups being controlled by an access control line, said method comprising the steps of:
  receiving a data access request to access a selected storage cell;
  connecting a selected one of said access control lines to a voltage level to allow access via one of said access devices to said selected storage cell; and
  connecting a capacitor to said selected access control line to change said voltage level supplied to said selected access control line.

16. A method according to claim 15, comprising an initial step of precharging said capacitor to store a predetermined amount of charge, said predetermined amount of charge depending on a control signal received from said control circuitry and determining whether said change to said voltage level is an increase or a decrease in said voltage level.

17. A method according to claim 15, comprising the further steps of:
  following connecting said access control line to said voltage level;
  determining when said access control line connected to said voltage level attains a predetermined value; and
  in response to determining attainment of said predetermined value isolating said capacitor from a voltage supply and isolating said access control line from said selected voltage prior to connecting said capacitor to said access control line.

18. A method according to claim 17, comprising an initial step of selecting said predetermined value in response to receipt of a tuning signal.

19. A semiconductor memory storage means comprising:
  a plurality of storage cell means for storing data;
  a plurality of access means for allowing access to said corresponding plurality of storage cell means, said plurality of access means being arranged in at least two groups, each of said at least two groups being controlled by an access control line;
  access control means for controlling a voltage level supplied to a selected one of at least two of said access control lines during access to said storage cell means, said access control means comprising a capacitor and means for switching; and
  control means responsive to a data access request to access a selected storage cell means to:
  connect a selected one of said access control lines to a voltage level to allow access via one of said access means to said selected storage cell means; and
  control said means for switching of said access control means to connect said capacitor of said access control means to said selected access control line and thereby change said voltage level supplied to said selected access control line.

* * * * *